(12) United States Patent
Huang

(10) Patent No.: US 11,309,899 B2
(45) Date of Patent: Apr. 19, 2022

(54) TIME-TO-DIGITAL CONVERSION CIRCUIT AND METHOD OF THE SAME

(71) Applicant: SHENZHEN GOODIX TECHNOLOGY CO., LTD., Guangdong (CN)

(72) Inventor: Yen-Yin Huang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 10 days.

(21) Appl. No.: 17/009,484

(22) Filed: Sep. 1, 2020

(65) Prior Publication Data
US 2020/0403625 A1    Dec. 24, 2020

Related U.S. Application Data

(63) Continuation of application No. PCT/CN2019/078448, filed on Mar. 18, 2019.

(51) Int. Cl.
*H03M 1/00* (2006.01)
*H03L 7/099* (2006.01)
(Continued)

(52) U.S. Cl.
CPC .......... *H03L 7/0991* (2013.01); *H03L 7/0818* (2013.01); *H03L 7/145* (2013.01); *H03L 7/148* (2013.01); *H03M 1/508* (2013.01)

(58) Field of Classification Search
CPC ..... H03L 7/0991; H03L 7/0818; H03L 7/145; H03L 7/148; H03M 1/508; H03M 1/50; H03K 3/0315; G04F 10/005
(Continued)

(56) References Cited

U.S. PATENT DOCUMENTS 9,092,013 B2    7/2015  Song et al.
2003/0076181 A1    4/2003  Tabatabaei et al.
(Continued)

FOREIGN PATENT DOCUMENTS

CN    2736821 Y    10/2005
CN    103425043 A    12/2013
(Continued)

OTHER PUBLICATIONS

English Abstract Translation of Foreign Reference CN109104190A.
English Abstract Translation of Foreign Reference CN103425043A.
English Abstract Translation of Foreign Reference CN106168753A.
English Abstract Translation of Foreign Reference CN106066599A.
(Continued)

*Primary Examiner* — Richard Tan
(74) *Attorney, Agent, or Firm* — WPAT, P.C., Intellectual Property Attorneys; Anthony King

(57) ABSTRACT

The application discloses a time-to-digital conversion circuit (100) including a first oscillator (110), a second oscillator (120), a first counting circuit (130), a second counting circuit (140), a first conversion circuit (150) and a processing circuit (160). The first oscillator is activated by a first signal and includes oscillating units having a first delay amount, wherein the first counting circuit is configured to count a number of times that the first tail end output signal of the first oscillator changes and store the same as a first counting result; the second counting circuit counts a number of oscillating units with an output change, other than the first tail end oscillating unit and stores the same as a second counting result; the first conversion circuit generates a first conversion signal according to the first counting result and the second counting result; the processing circuit generates the output signal at least according to the first conversion signal.

20 Claims, 7 Drawing Sheets

(51) Int. Cl.
*H03L 7/081* (2006.01)
*H03L 7/14* (2006.01)
*H03M 1/50* (2006.01)

(58) Field of Classification Search
USPC ........................................................ 341/128
See application file for complete search history.

(56) References Cited

U.S. PATENT DOCUMENTS

| | | | |
|---|---|---|---|
| 2015/0077279 A1 | 3/2015 | Song et al. | |
| 2015/0220065 A1 | 8/2015 | Sua Vinay et al. | |
| 2018/0088535 A1* | 3/2018 | Wang | G04F 10/005 |

FOREIGN PATENT DOCUMENTS

| | | | |
|---|---|---|---|
| CN | 106066599 A | | 11/2016 |
| CN | 106168753 A | | 11/2016 |
| CN | 106354001 A | | 1/2017 |
| CN | 106444344 A | | 2/2017 |
| CN | 108170018 A | | 6/2018 |
| CN | 109104190 A | | 12/2018 |
| JP | H104353 A | | 1/1998 |
| JP | 2010273118 | | 12/2010 |
| JP | 2012175598 | | 9/2012 |
| WO | WO2012141451 A2 | | 10/2012 |

OTHER PUBLICATIONS

English Abstract Translation of Foreign Reference CN106444344A.
English Abstract Translation of Foreign Reference CN2736821Y.
English Abstract Translation of Foreign Reference CN106354001A.
English Abstract Translation of Foreign Reference WO2012141451A2.
International Searching Authority (ISA) Form 210—International Search Report of PCT/CN2019/078448.
International Searching Authority (ISA) Form 220—Notification of Transmittal of the International Search Report of PCT/CN2019/078448.
International Searching Authority (ISA) Form 237—Written Opinion of PCT/CN2019/078448.
As-filed PCT Request of PCT/CN2019/078448.
As-filed PCT Application of PCT/CN2019/078448.
Notification of Receipt of Search Copy in Chinese (Form PCT/ISA/202) of PCT/CN2019/078448.
English abstract translation of JP2010273118.
English abstract translation of JP2012175598.
English abstract translation of JPH104353A.

* cited by examiner

TIME-TO-DIGITAL CONVERSION CIRCUIT AND METHOD OF THE SAME

CROSS-REFERENCE TO RELATED APPLICATIONS

This application is a continuation of International Application No. PCT/CN2019/078448, filed on Mar. 18, 2019, the disclosure of which is hereby incorporated by reference in its entirety.

TECHNICAL FIELD

The present application relates to a digital conversion circuit and a related method.

BACKGROUND

Recently, with the advancement of the ranging technology, ranging can be applied to complex cases such as 3D ranging from a whole picture. It is even more common in the measurement systems, such as those for use in measuring the liquid level, flow rate, and flow volume, and for material detection, medical ultrasound, and the like.

In this context, the most common methods used are either optical and ultrasonic ones; however, no matter whether the final choice is an optical-based or ultrasonic-based technology, a circuit is required to detect the time signals, and the resolution, as well as the cost of this circuit, are factors to be considered in the design.

SUMMARY OF THE INVENTION

One purpose of the present application is to disclose a time-to-digital conversion and a related method to address the above-mentioned issues.

One embodiment of the present application discloses a time-to-digital conversion circuit, which comprises a first oscillator, a second oscillator, a first counting circuit, a second counting circuit, a first conversion circuit, and a processing circuit. The first oscillator is activated by a first signal and comprises a plurality of oscillating units having a first delay amount, wherein the first starting end oscillating unit of the plurality of oscillating units in the first oscillator receives the first signal and a first tail end output signal, and the first tail end oscillating unit of the plurality of oscillating units in the first oscillator is configured to generate the first tail end output signal. The first counting circuit is coupled to the first oscillator and configured to count the number of times that the first tail end output signal changes and store the counted number as a first counting result. The second counting circuit is coupled to the first oscillator, and configured to count the number of oscillating units with an output change, other than the first tail end oscillating unit, whenever the output of the first starting end oscillating unit changes, and store the number of the oscillating units as a second counting result. The second oscillator is coupled to the first oscillator through the first counting circuit and the second counting circuit, and the second oscillator is activated by the second signal. The first conversion circuit is coupled to the first counting circuit and the second counting circuit and is configured to generate a first conversion signal according to the first delay amount and the first counting result and the second counting result stored when the second oscillator is activated, wherein the first conversion signal indicates a first estimated time difference. The processing circuit is configured to generate an output signal at least according to the first conversion signal, wherein the output signal indicates the measured time difference between an activation time of the first signal and an activation time of the second signal. Using the time-to-digital conversion circuit disclosed by the present application, the first counting circuit and the second counting circuit can continuously count the number of times that the oscillating unit of the first oscillator oscillates as long as the oscillating unit continuously oscillates, even though there are only a limited amount of oscillating units comprised in the first oscillator. In this way, the time-to-digital conversion circuit proposed in the present application can achieve the same objective without consuming a large area to implement an oscillator, which will greatly reduce the production cost and power consumption.

One embodiment of the present application discloses a time-to-digital conversion method, which comprises the steps of: transmitting a first signal to activate a first oscillator, wherein the first oscillator comprises a plurality of oscillating units having a first delay amount, and the first starting end oscillating unit of the plurality of oscillating units in the first oscillator receives the first signal and the first tail end output signal, the first tail end oscillating unit of the plurality of oscillating units in the first oscillator is configured to generate the first tail end output signal; transmitting a second signal to activate a second oscillator; counting the number of times that the first tail end output signal changes, and storing the counted number as a first counting result; counting the number of oscillating units with an output change, other than the first tail end oscillating unit, whenever the output of the first starting end oscillating unit changes, and storing the number of the oscillating units as a second counting result; generating a first conversion signal according to the first delay amount and the first counting result and the second counting result stored when the second oscillator is activated, wherein the first conversion signal indicates a first estimated time difference; and generating an output signal at least according to the first conversion signal, wherein the output signal represents the measured time difference between an activation time of the first signal and an activation time of the second signal.

DETAILED DESCRIPTION

Figure 1:
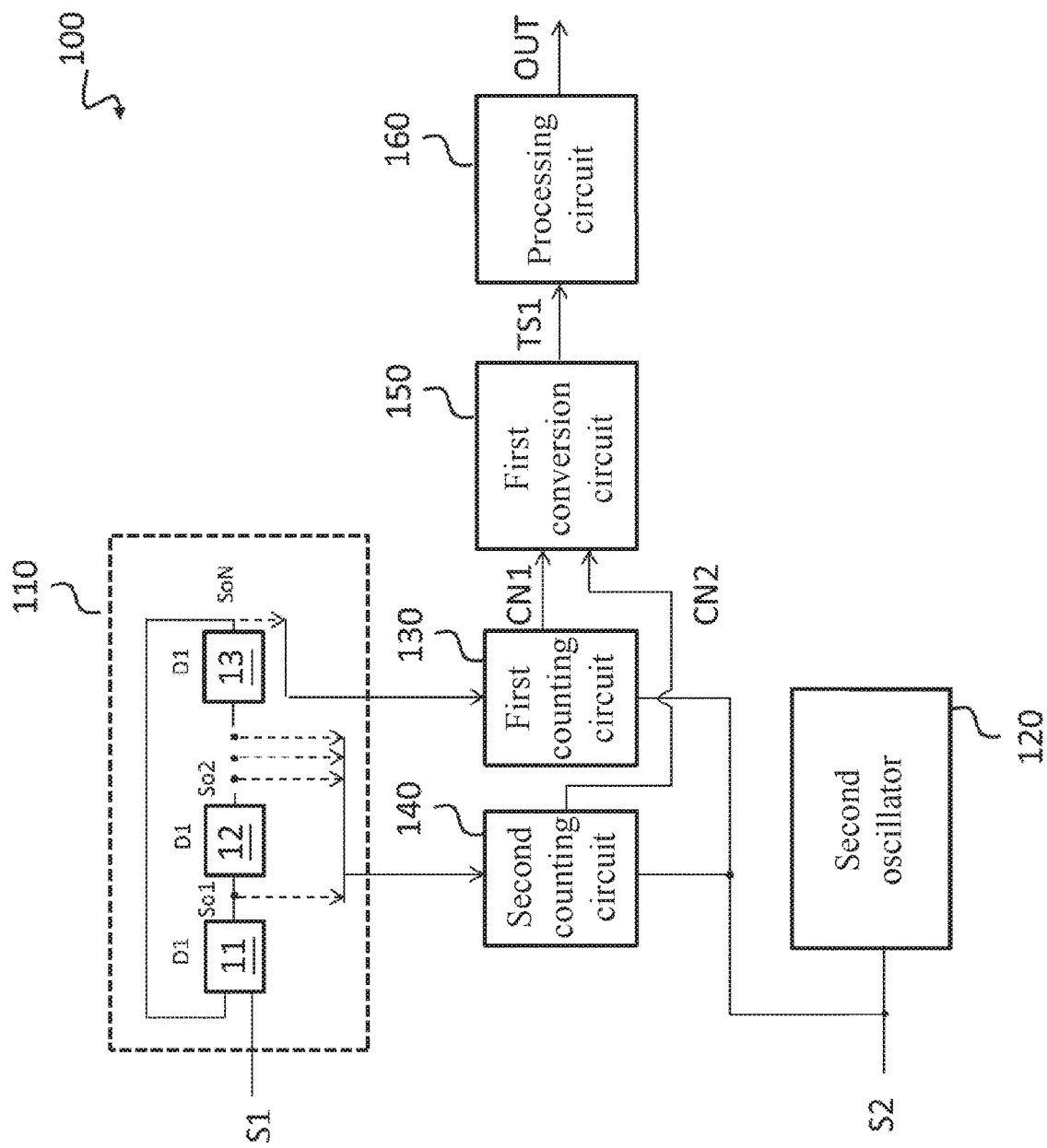
FIG. 1 is a schematic diagram illustrating a time-to-digital conversion circuit according to the first embodiment of the present application.

The following disclosure provides many different embodiments, or examples, for implementing different features of the invention. Specific examples of components and arrangements are described below to simplify the present disclosure. As could be appreciated, these are, of course, merely examples and are not intended to be limiting. For example, the formation of a first feature over or on a second feature in the description that follows may include embodiments in which the first and the second features are formed in direct contact, and may also include embodiments in which additional features may be formed between the first and the second features, such that the first and the second features may not be in direct contact. Also, the present disclosure may repeat reference numerals and/or letters in the various examples. This repetition is for simplicity and clarity and does not in itself dictate a relationship between the various embodiments and/or configurations discussed.

Further, spatially relative terms, such as "beneath," "below," "lower," "above," "upper," and the like, may be used herein for the ease of the description to describe one element or feature's relationship with respect to another element(s) or feature(s) as illustrated in the drawings. The spatially relative terms are intended to encompass different orientations of the device in use or operation in addition to the orientation depicted in the figures. The apparatus may be otherwise oriented (e.g., rotated by 90 degrees or at other orientations) and the spatially relative descriptors used herein may likewise be interpreted accordingly.

Notwithstanding that the numerical ranges and parameters setting forth the broad scope of the invention are approximations, the numerical values outlined in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. As could be appreciated, other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters outlined in the present disclosure and attached claims are approximations that can vary as desired. At the very least, each numerical parameter should at least be construed considering the number of reported significant digits and by applying ordinary rounding techniques. Ranges can be expressed herein as from one endpoint to another endpoint or between two endpoints. All ranges disclosed herein are inclusive of the endpoints unless specified otherwise.

FIG. 1 is a schematic diagram illustrating a time-to-digital conversion circuit 100 according to the first embodiment of the present application. As shown in FIG. 1, the time-to-digital conversion circuit 100 includes a first oscillator 110, a second oscillator 120, a first counting circuit 130, a second counting circuit 140, a first conversion circuit 150, and a processing circuit 160. As shown in FIG. 1, the first oscillator 110 may be a ring oscillator. The first oscillator 110 includes N oscillating units, wherein N is an integer greater than 1; in the present embodiment, N is an odd number. Each of the N oscillating units in the first oscillator 110 has a first delay amount D1, and the N oscillating units include a first starting end oscillating unit 11, a first tail end oscillating unit 13 and a plurality of (i.e., N-2) oscillating units 12 coupled between the first starting end oscillating unit 11 and the first tail end oscillating unit 13. The first ring oscillating unit 110 is activated by the first signal S1; specifically, the starting end oscillating unit is defined as an oscillating unit (i.e., the first starting end oscillating unit 11) configured to receives the first signal S1, and the tail end oscillating unit is defined as an oscillating unit (i.e., first tail end oscillating unit 13) whose output is received by the starting end oscillating unit. The first starting end oscillating unit 11 receives the first signal S1 and the first tail end output signal SoN generated by the first tail end oscillating unit and generates an output signal So1 to the oscillating unit 12. The oscillating unit 12 receives the output signal So1 and generates an output signal So2 based on the output signal So1, and so on.

In the present embodiment, the second oscillator 120 can also be a ring oscillator; however, the present embodiment is not limited thereto. In contrast to the first oscillator 110, the second oscillator 120 is activated by the second signal S2.

The first counting circuit 130 is configured to count the number of times that the first tail end output signal SoN changes, and stores the number of times that is counted as a first counting result CN1. Specifically, when the first tail end output signal SoN transits from logic value '0' into logic value '1,' the first counting result CN1 generated by the first counting circuit 130 is added with 1; similarly, when the first tail end output signal SoN transits from logic value '1' into logic value '0,' the first counting result CN1 generated by the first counting circuit 130 is added with 1. The second counting circuit 140 is configured to count the number of the remaining oscillating unit (i.e., the first starting end oscillating unit 11 and the plurality of oscillating units 12) with an output change other the first tail end oscillating unit 13, whenever the output of the first starting end oscillating unit 11 changes, and store the number of the oscillating unit as a second counting result CN2. Specifically, if the first oscillator 110 continues to oscillate, then the output of the plurality of oscillating units of the first oscillator 110 continues to change; when the first tail end output signal SoN changes, it means that the signal change has completed a cycle; at this time, the first counting result CN1 generated by the first counting circuit 130 is added with 1, and the second counting result CN2 is reset. Thereafter, since the first tail end output signal SoN changes, the output signal So1 will then change correspondingly; at this time, the second counting result CN2 generated by the second counting circuit 140 is indicated as 1; next, since the output signal So1 changes, the output signal So2 will then change correspondingly; at this time, the second counting result CN2 generated by the second counting circuit 140 is indicated as 2, and so on; until the first tail end output signal SoN changes once again; at this time, the first counting result CN1 generated by the first counting circuit 130 is added with 1, and the second counting result CN2 is reset. Correspondingly, the output signal So1 then changes once again; at this time, the second counting result CN2 generated by the second counting circuit 140 will be indicated as 1 once again. It should be noted that each of the first counting circuit 130 and the second counting circuit 140 may include a storage circuit, configured to store the first counting result CN1 and the second counting result CN2, respectively. However, in other embodiments, the storage circuit can be disposed outside of the first counting circuit 130 and the second counting circuit 140; in other words, the storage circuit and the first counting circuit 130 as well as the second counting circuit 140 can be arranged independently.

When the second oscillator 120 is activated by the second signal S2, the first counting circuit 130 and the second counting circuit 140 are triggered simultaneously to transmit the stored first counting result CN1 and second counting result CN2 to the first conversion circuit 150. The first conversion circuit 150 generates a first conversion signal TS1 according to a first delay amount D1 and the first counting result CN1 and the second counting result CN2 thus-received, wherein the first conversion signal TS1 is configured to indicate a first estimated time difference between the activation time of the first signal S1 and the activation time of the second signal S2. The processing circuit 160 is configured to generate an output signal OUT at least according to the first conversion signal TS1, wherein the output signal OUT indicates a measured time difference between the activation time of the first signal S1 and the activation time of the second signal S2.

To detect the time difference between two signals, most common prior art time-digital converters must approximate the desired time difference by accumulating the difference between the delay amounts of two oscillators, and the final value obtained at transition is the desired result. Nevertheless, in the conventional technical means, when it is desired that the detection range of the time difference between the two signals to be large enough while at the same time a high resolution to be achieved, then the design scheme requires a smaller difference in the delay amounts between the two oscillators, and the integrator requires more stages of circuit architecture; therefore, to implement the desired circuit, the area occupied by the integrator is relatively large. This design approach, however, makes the overall hardware cost too high; meanwhile, when high resolution is required, the difference in the delay amount between the two oscillators will also have a large deviation ratio. Since the time-to-digital conversion circuit 100 according to the present application properly designs the first oscillator 110, the first counting circuit 130, and the second counting circuit 140, which cycle the oscillation signal in the first oscillator 110 continuously and obtain the number of times that the output of the oscillating unit in the first oscillator 110 changes using the first counting circuit 130 and the second counting circuit 140; in this way, the calculation of the time difference between the activation time of the first signal S1 and the activation time of the second signal S2 does not require excessive circuit architecture, thereby saving the design cost and power consumption.

Figure 2:
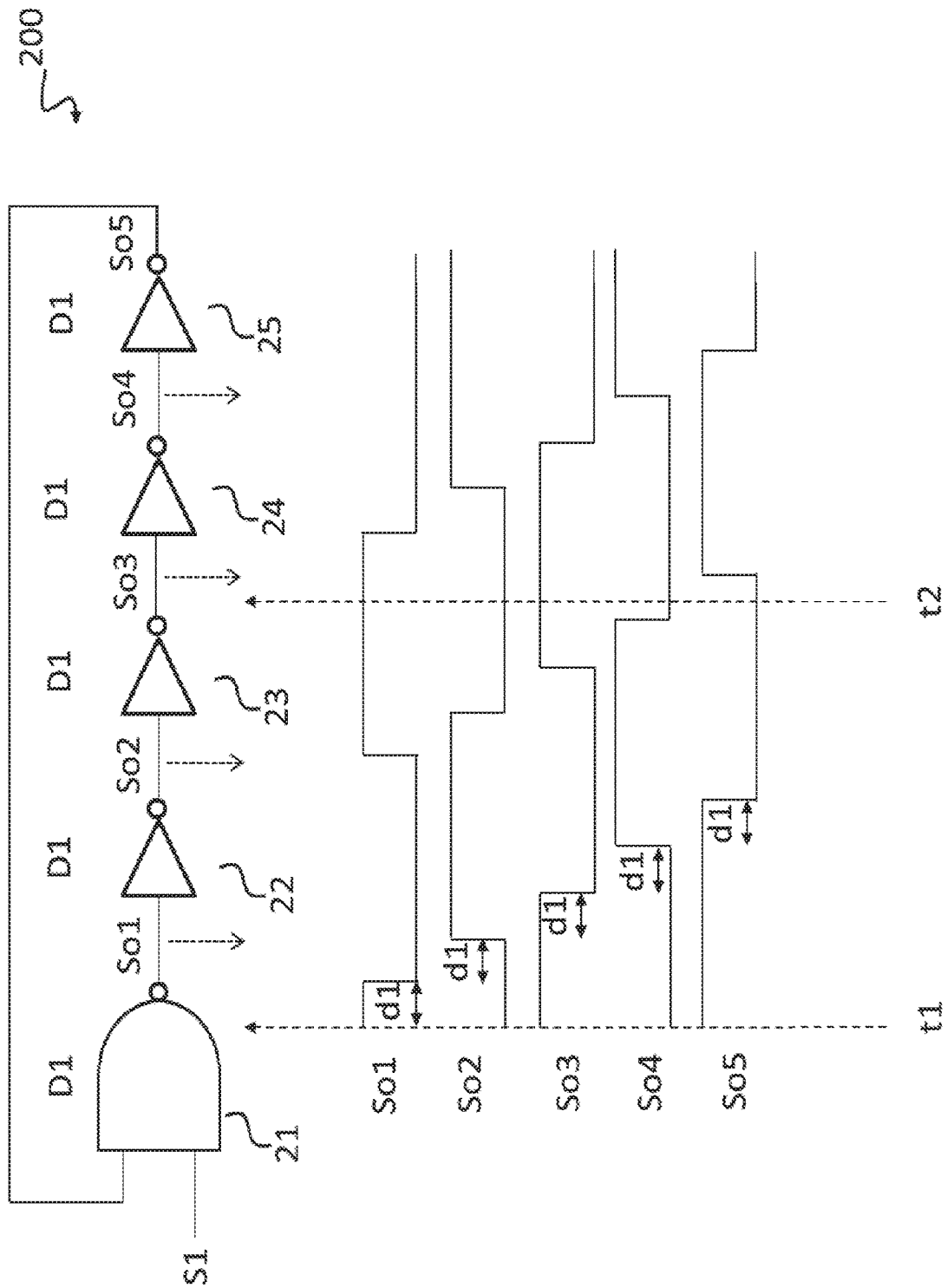
FIG. 2 is a schematic diagram illustrating a first oscillator and an oscillating unit output according to one embodiment of the present application.

FIG. 2 is a schematic diagram illustrating a first oscillator 200 according to one embodiment of the present application, wherein the first oscillator 200 of the present embodiment is configured to implement the first oscillator 110. The first oscillator 200 may be a ring oscillator, and the first oscillator 200 includes a NAND gate 21 and a plurality of inverters 22, 23, 24, 25, wherein the NAND gate 21 is configured to implement the first starting end oscillating unit 11 in the first oscillator 110, the inverters 22, 23, 24 are configured to implement a plurality of oscillating units 12 in the first oscillator 110, and the inverter 25 is configured to implement first tail end oscillating unit 13 of the first oscillator 110. The NAND gate 21 receives a first signal S1 and a first tail end output signal So5 generated by the inverter 25, and generates an output signal So1 accordingly; the inverter 22 receives the output signal So1 and generates an output signal So2 accordingly; the inverter 23 receives the output signal So2 and generates an output signal So3 accordingly; the inverter 24 receives the output signal So3 and generates an output signal So4 accordingly, and the inverter 25 receives the output signal So4 and generates the first tail end output signal So5 accordingly.

Referring to the waveform shown in the lower part of FIG. 2; when the first signal S1 is activated at the time point t1, after one first delay amount D1, the output signal So1 transits; and after one first delay amount D1, the output signal So2 transits, and so on. As shown in FIG. 2, when the second signal S2 is activated at the time point t2, since the first tail end output signal So5 transits once, the first counting result CN1 generated by the first counting circuit 130 in FIG. 1 is indicated as 1; and after the first transition of the first tail end output signal So5, all of the output signal So1, the output signal So2, the output signal So3 and the output signal So4 change (transit), and hence, the second counting result CN2 generated by the second counting circuit 140 is indicated as 4. Since the first oscillator 200 includes five oscillating units, the first conversion circuit 150 in FIG. 1 generates a first conversion signal TS1 according to the first delay amount D1, the first counting result CN1 and the second counting result CN2, and the first estimated time difference indicated by the first conversion signal TS1 can be expressed as (1*5+4)*D1.

Figure 3:
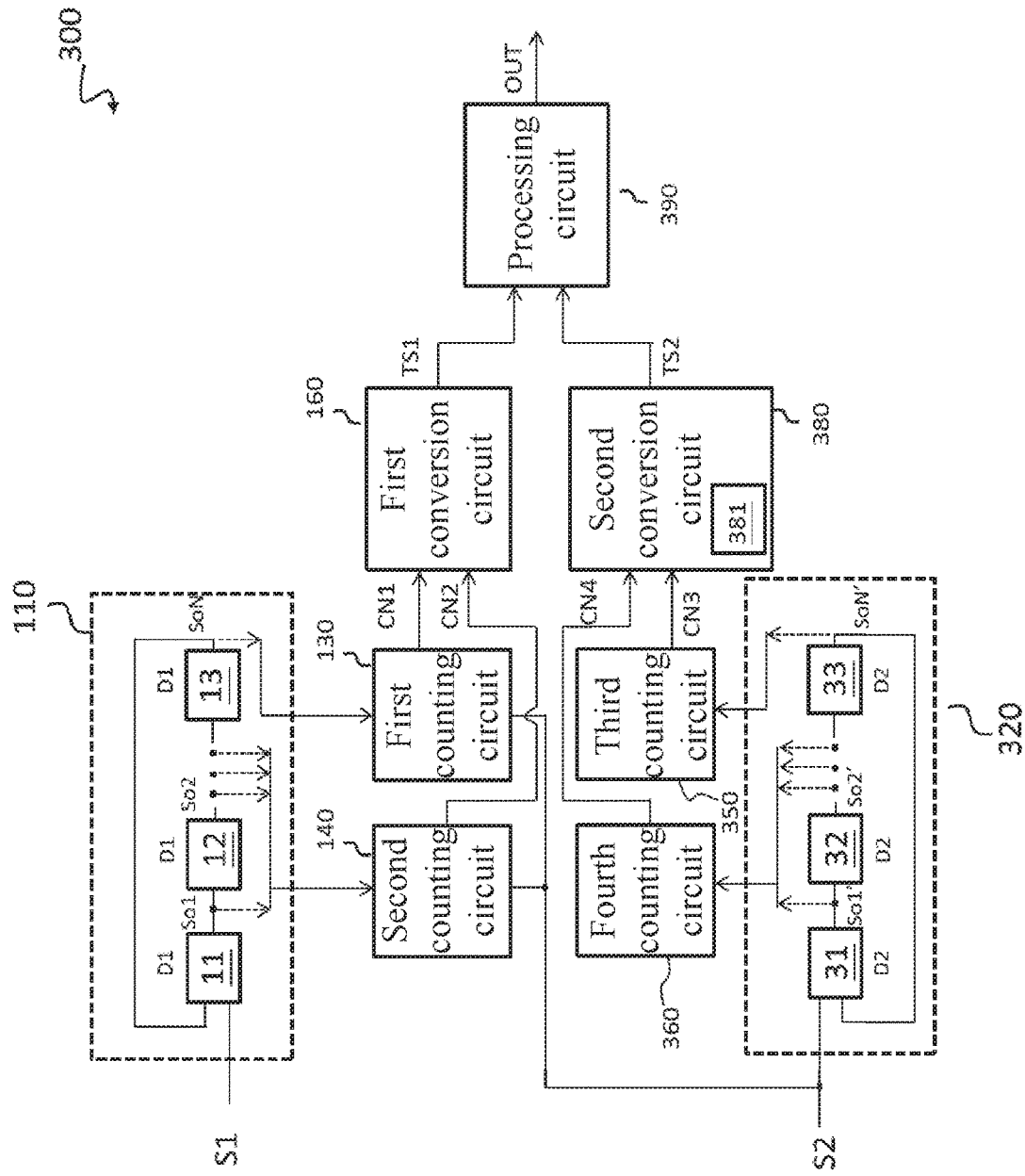
FIG. 3 is a schematic diagram illustrating a time-to-digital conversion circuit according to the second embodiment of the present application.

FIG. 3 is a schematic diagram illustrating a time-to-digital conversion circuit 300 according to the second embodiment of the present application. The time-to-digital conversion circuit 300 is similar to the time-to-digital conversion circuit 100; both include a first oscillator 110, a first counting circuit 130, a second counting circuit 140 and a first conversion circuit 150; the operations of these circuits are described in connection with the embodiments of FIG. 1 and FIG. 2, and hence, a detailed description thereto is omitted herein for the sake of brevity. In addition to the above-mentioned circuits, the time-to-digital conversion circuit 300 further includes a second oscillator 320, a third counting circuit 350, a fourth counting circuit 360, a second conversion circuit 380, and a processing circuit 390. The second oscillator may be a ring oscillator, which includes N oscillating units, wherein N is an integer greater than 1. Each of the N oscillating units has a second delay amount D2 and includes a second starting end oscillating unit 31, a second tail end oscillating unit 33, and a plurality of oscillating units 32 coupled between the second starting end oscillating unit 31 and the second tail end oscillating unit 33. The second ring oscillating unit 320 is activated by the second signal S2; specifically, the second starting end oscillating unit 31 receives the second signal S2 and a second tail end output signal SoN' generated by the second tail end oscillating unit 33 and generates an output signal So1' to the oscillating unit 32. The oscillating unit 32 receives the output signal So1' and generates an output signal So2' accordingly, and so on. Persons having ordinary skill in the art can readily understand that there should be an odd number of oscillating units in the second oscillator 320 for generating the oscillation signal should.

Like the first counting circuit 130, the third counting circuit 350 is configured to count the number of times that the second tail end output signal SoN' changes, and store the counted number as a third counting result CN3. Specifically, when the second tail end output signal SoN' transits from the logic value of '0' to the logic value of '1,' the third counting result CN3 generated by the third counting circuit 350 is added with 1; similarly, when the second tail end output signal SoN' transits from the logic value of '1' to the logic value of '0,' the third counting result CN3 generated by the third counting circuit 350 is added with 1. The fourth counting circuit 360 is configured to count the number of the oscillating units (i.e., the second starting end oscillating unit 31 and the plurality of oscillating units 32), other than the second tail end oscillating unit 33, that have the output change, whenever the output of the second starting end oscillating unit 31 changes, and store the number of the oscillating unit as a fourth counting result CN4.

Specifically, if the second oscillator 320 continues to oscillate, then the output of the plurality of oscillating units in the second oscillator 320 continues to change; when the second tail end output signal SoN' changes, it means that the signal change has completed a cycle; at this time; at this time, the third counting result CN3 generated by the third counting circuit 350 is added with 1. Thereafter, since the second tail end output signal SoN' changes, the output signal So1' will then change correspondingly; at this time, the fourth counting result CN4 generated by the fourth counting circuit 360 is indicated as 2, and so on; until the second tail end output signal SoN' changes once again; at this time, third first counting result CN3 generated by the third counting circuit 350 is added with 1. Correspondingly, the output signal So1' then changes once again; at this time, the fourth counting result CN4 generated by the fourth counting circuit 360 is once again indicated as 1.

It should be noted that each of the third counting circuit 350 and the fourth counting circuit 360 may include a storage circuit, configured to store the third counting result CN3 and the fourth counting result CN4, respectively. However, in other embodiments, the storage circuit can be disposed outside of the third counting circuit 350 and the fourth counting circuit; in other words, the storage circuit and the third counting circuit 350 as well as the fourth counting circuit 360 can be arranged independently.

In other embodiments, the third counting circuit 350 may be implemented by the first counting circuit 130, and the fourth counting circuit 360 may be implemented by the second counting circuit 140. In this way, when the second oscillator 320 is activated by the second signal S2, the first counting circuit 130 is configured to count the number of times that the second tail end output signal SoN' changes, and store the counted number as a third counting result CN3. The second counting circuit 140 is configured to count the number of the oscillating units (i.e., the second starting end oscillating unit 31 and the plurality of oscillating units 32), other than the second tail end oscillating unit 33, that have an output change, whenever the output of the second starting end oscillating unit 31 changes, and store the number of the oscillating unit as a fourth counting result CN4.

After activating the second ring oscillator 320, the second conversion circuit 380 is configured to generate a second conversion signal TS2 according to a first delay amount D1, a second delay amount D2, a third counting result CN3 and a fourth counting result CN4, wherein the second conversion signal TS2 indicates a second estimated time difference, and the second estimated time difference is smaller than the first delay amount D1. In the present embodiment, the second conversion circuit 380 includes a logic circuit 381, wherein after activating the second oscillator 320, and when the output of any oscillating units (i.e., second starting end oscillating unit 31, the plurality of oscillating units 32 and the second tail end oscillating unit 33) in the second oscillator 320 changes, the logic circuit 381 is configured to receive the output from any of the plurality of oscillating units (i.e., the first starting end oscillating unit 11, the plurality of oscillating units 12 and the first tail end oscillating unit 13) of the first oscillator 110, and perform the logic operation according to the output of the plurality of oscillating units of the first oscillator 110 and the output the oscillating unit of the second oscillator 320 that haven an output change, to generate a logic result. Detailed operations regarding the second conversion circuit 380 and the logic circuit 381 will be provided in the following paragraphs. It should be noted that to keep the drawing simple, the connections between the logic circuit 381 and the other circuits are not illustrated in full in FIG. 3.

The processing circuit 390 is configured to generate an output signal OUT according to the first conversion signal TS1 and the second conversion signal TS2, wherein the output signal represents a measured time difference between the activation time of the first signal S1 and the activation time of the second signal S2. It should be noted that the first oscillator 200 shown in FIG. 2 is also applicable for implementing the second oscillator 320.

Figure 4:
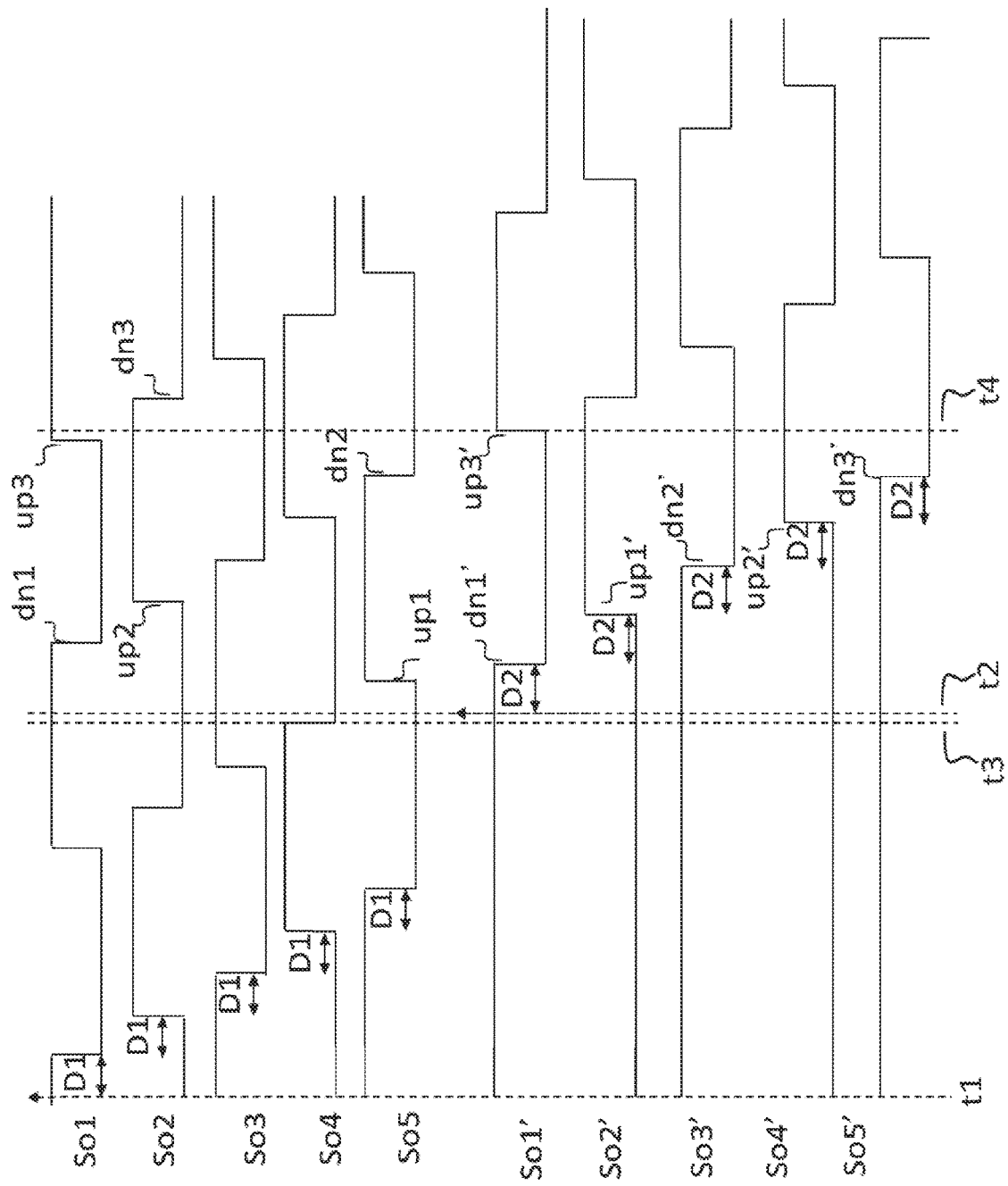
FIG. 4 is a schematic diagram illustrating the waveform outputted by the first oscillator and the second oscillator according to one embodiment of the present application.

Following the embodiment of FIG. 2, FIG. 4 is a schematic diagram illustrating the waveform outputted by the first oscillator 110 and the second oscillator 320 according to one embodiment of the present application. In the present embodiment, the second delay amount D2 is slightly greater than the first delay amount D1. As shown in FIG. 4, the first signal S1 is activated at the time point t1, and the second signal S2 is activated at the time point t2. When the second signal S2 is activated at the time point t2, output signal So1' transits after one second delay amount D2 passes; and then the output signal So2' transits after one second delay amount D2 passes, and so on. When the output signal So1' transits for the first time, i.e., when the falling edge dn1' takes place, the falling edge dn1' locates behind the rising edge up1 of the first tail end output signal So5 and ahead the falling edge dn1 of the output signal So1; then, after one second delay amount D2, the output signal So2' transits for the first time, i.e., when the rising edge up1' takes place, the rising edge up1' locates behind the falling edge dn1 of the output signal So1 and ahead the rising edge up2 of the output signal So2; however, since the second delay amount D2 is slightly greater than the first delay amount D1, the distance between the rising edge up1' and the rising edge up2 is smaller than the distance between the falling edge dn1 and the falling edge dn1'. This situation continues until the time point t4, where the rising edge up3' of the output signal So1' locates behind the rising edge up3 of the output signal So1. If the first delay amount D1 and the second delay amount D2 are the same, then the rising edge up3' of the output signal So1' should locate behind the falling edge dn2 and ahead the rising edge up3, however, since the second delay amount D2 is slightly greater than the first delay amount D1, the rising edge up3' falls behind the rising edge up3 at the time point t4. When this happens, the third counting result CN3 and the fourth counting result CN4 are transmitted to the second conversion circuit 380.

At the time point t4, because the signal completes one cycle of transition, the third counting result CN3 is indicated as 1, and because the output signal So1' completes the transition, the fourth counting result CN4 is indicated as 1. As indicated above, the second conversion circuit 380 can find out that 1*5+1=6 delays are passed from time points t2 to t4 according to; therefore, a period of 6*D2 has passed from time points t2 to t4 according to the second delay amount D2. Since the first delay amount D1 experienced by the first oscillator 110 is one more than the second delay amount D2 experienced by the second oscillator 320, the second conversion circuit 380 generates the second conversion signal TS2 according to the first delay amount D1, the second delay amount D2, the third counting result CN3 and the fourth counting result CN4, wherein the second estimated time difference indicated by the second conversion signal TS2 can be expressed as (6+1)*D1−6*D2, and the second estimated time difference is the time difference between the time points t3 and t2.

Since the first conversion signal TS1 is generated according to the first counting result CN1 and the second counting result CN2, the first estimated time difference indicated by the first conversion signal TS1 is the time difference between time points t1 and t3, and the second estimated time difference indicated by the second conversion signal TS2 is the time difference between time points t2 and t3. The processing circuit 390 generates the output signal OUT according to the first conversion signal TS1 and the second conversion signal TS2.

Next, the discussion is directed to how the second conversion circuit 380 determines that the rising edge up3' of the output signal So1' locates behind the rising edge up3 of the output signal So1. When the falling edge dn1' of the output signal So1' takes place, the logic value of the output of the plurality of corresponding oscillating units in the first oscillator 110 (i.e., the output signals So1, So2, So3, So4, and the first tail end output signal So5) is '10101.' After the logic circuit 381 receives the logic value of '10101' and performs the logic operation on the logic value of '10101' and the logic value of '0' of the output signal So1, it ascertains that, at this time, the first tail end output signal So5 just transits whereas the output signal So1 has not completed the transition. For example; at this time, there are the same numbers of 0 and 1 in the logic value '10101' and the logic value '0,' and hence, it is determined that the falling edge dn1' of the output signal So1' locates behind the rising edge up1 of the first tail end output signal So5 and before the falling edge dn1 of the output signal So1. Therefore, the second conversion circuit 380 generates a logic result indicating a certain logic value, such as the logic value of '0.'

When the rising edge up1' of the output signal So2' takes place, the logic value of the output of the plurality of corresponding oscillating units in the first oscillator 110 is '00101.' After the logic circuit 381 receives the logic value of '00101' and performs the logic operation on the logic value of '00101' and the logic value of '1' of the output signal So2, it ascertains that, at this time, the output signal So1 just transits whereas the output signal So2 has not completed the transition. For example; at this time, there are the same numbers of 0 and 1 in the logic value '00101' and the logic value '1,' and hence, it is determined that the rising edge up1' of the output signal So2' locates behind the falling edge dn1 and before the rising edge up2. Therefore, the second conversion circuit 380 generates a logic result indicating a logic value of '0.' When the rising edge up3' takes place, originally, the rising edge up3' should locate between the falling edge dn2 and the rising edge up3, thereby obtaining a logic value of the output of the plurality of corresponding oscillating units in the first oscillator 110 as '01010;' however, since the second delay amount D2 is slightly greater than the first delay amount D1, the rising edge up3' locates behind the rising edge up3, and consequently, the logic value of the output of the plurality of corresponding oscillating units in first oscillator 110 thus obtained is '11010.' Therefore, after the logic circuit 381 performs the logic operation on the logic value of '11010' and the logic value of '1' of the output signal So1,' it ascertains that the rising edge up3' of the output signal So1' locates behind the rising edge up3 of the output signal So1. For example, at this time, the numbers of 0 and 1 in the logic value '11010' and the logic value '1' are different, and hence, the second conversion circuit 380 generates a logic result indicating a different logic value of '1.'

It should be noted that, in the embodiment of FIG. 4, the second delay amount D2 is slightly greater than the first delay amount D1; however, the present application is not limited thereto. In other embodiments, the second delay amount D2 is slightly smaller than the first delay amount D1, and the operations of the second conversion circuit 380 and the logic circuit 381 are similar to those described in connection with the embodiment of FIG. 4; hence, a detailed description thereto is omitted herein for the sake of brevity.

Figure 5:
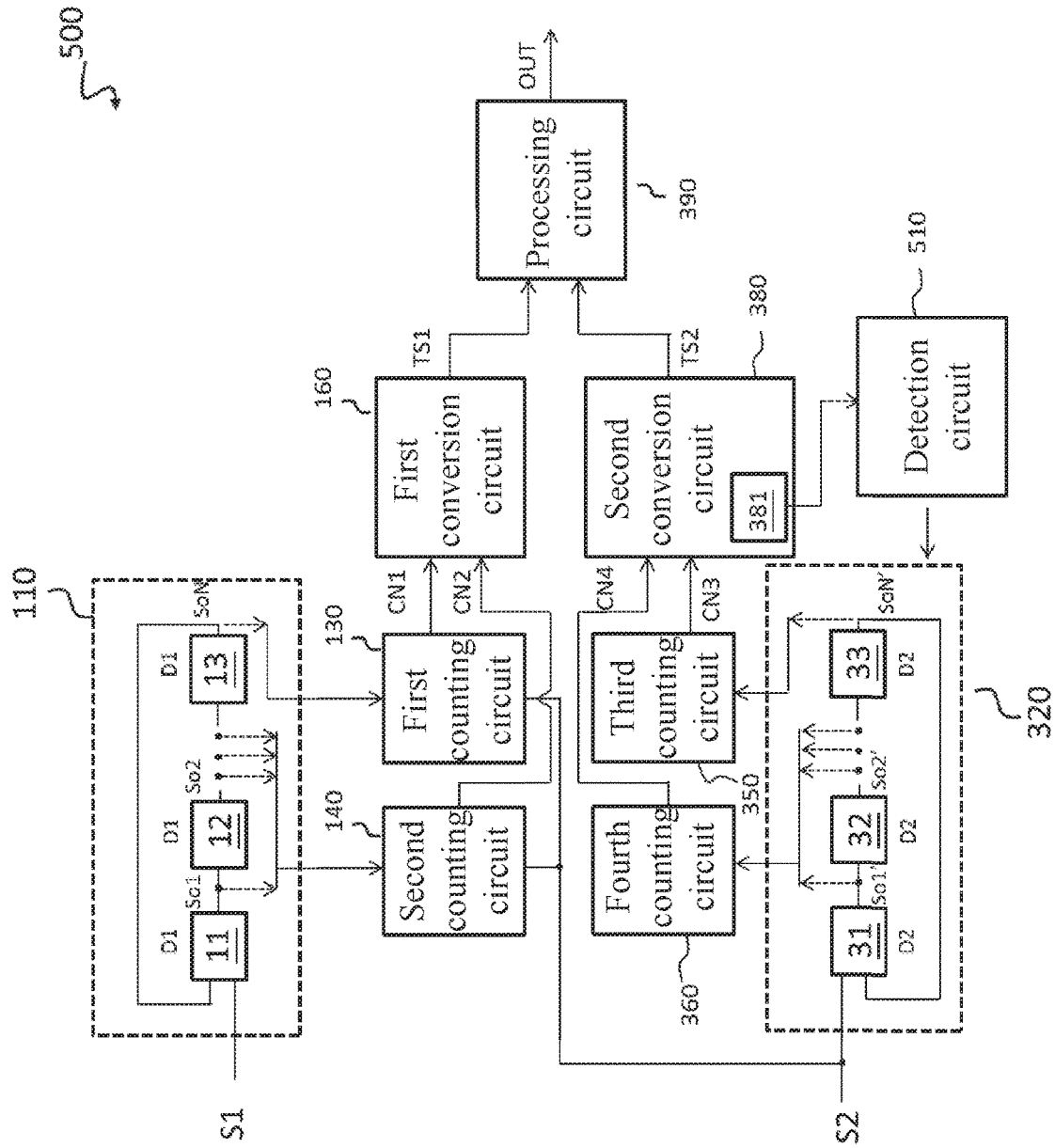
FIG. 5 is a schematic diagram illustrating a time-to-digital conversion circuit according to the third embodiment of the present application.

FIG. 5 is a schematic diagram illustrating a time-to-digital conversion circuit 500 according to the third embodiment of the present application. The time-to-digital conversion circuit 500 and the time-to-digital conversion circuit are substantially the same, with the exception that the time-to-digital conversion circuit 500 includes a detection circuit 510, a detection circuit 510 coupled to the logic circuit 381 and configured to adjust the oscillation frequency of the second oscillator 320 when the logic result generated by the logic circuit 381 changes; detailed functions of the detection circuit 510 are discussed in subsequent embodiments. In the present embodiment, the detection circuit 510 may include multiple sets of capacitors, and it adjusts the oscillation frequency of the second oscillator 320 by coupling the capacitors to the second oscillator 320.

Figure 6:
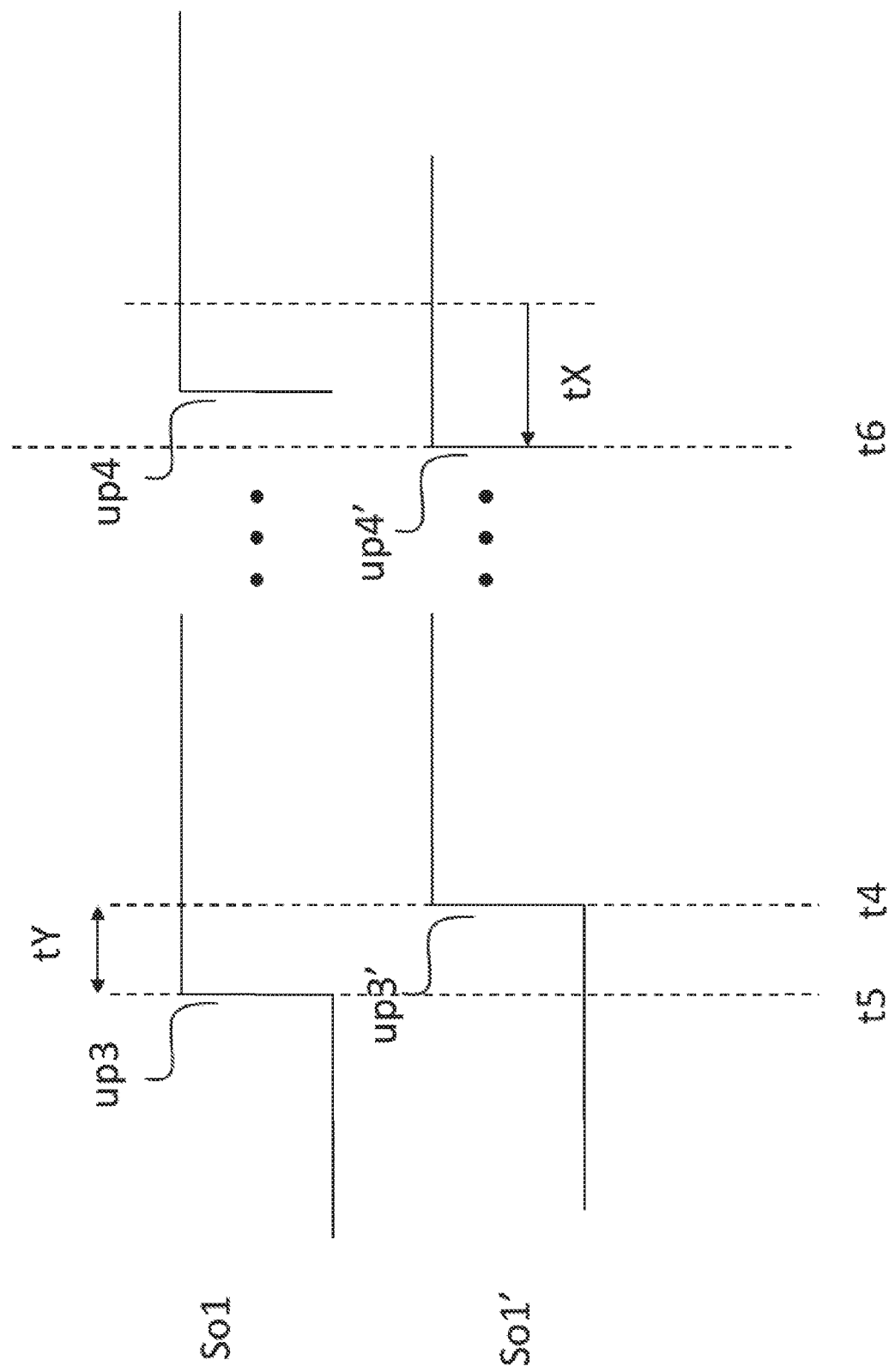
FIG. 6 is a schematic diagram illustrating the operation of a detection circuit according to one embodiment of the present application.

FIG. 6 is a schematic diagram illustrating the operation of a detection circuit 510 according to one embodiment of the present application. Following the embodiment of FIG. 4, at the time point t4, the output signal So1' transits, and the logic result determines that the rising edge up3' locates behind the rising edge up3; therefore, the detection circuit 510 increases the oscillation frequency of the second oscillator 320 so that after a period of time, the rising edge up4' of the output signal So1' locates before the rising edge up4 of the output signal So1. The detection circuit 510 may adjust the oscillation frequency of the second oscillator 320 so that the rising edge up4' is pushed forward by a fixed time difference tX, and since the second delay amount D2 and the first delay amount D1 remain unchanged, the logic circuit 381 described in the embodiment of FIG. 4 is used to determine when will the output of the second oscillator 320 locates behind the output of the first oscillator 110 once again, after adjusting the oscillation frequency of the second oscillator 320. Also, the second conversion circuit 380 may determine a time difference tY between time points t5 and t4, according to the first delay amount D1, the second delay amount D2, and the third counting result CN3 and fourth counting result CN4 at this time. In this way, the thus-generated second conversion signal TS2 will have an even higher resolution.

Specifically, assuming that the tX is 45 picoseconds, and the second delay amount D2 is greater than the first delay amount D1 by 5 picoseconds; assuming that three second delay amounts D2 have passed after the time point t6, and the falling edge of the output signal So4' is just aligned with the falling edge of the output signal So4, so it can be ascertained that the time difference tY between the time points t5 and t4 is 45−3*5=30 picoseconds. Reference is made to both embodiments in FIG. 4 and FIG. 6, wherein the second conversion circuit 380 generates a second conversion signal TS2 according to the first delay amount D1, the second delay amount D2, the third counting result CN3 and the fourth counting result CN4, wherein the second estimated time difference indicated by the second conversion signal TS2 can be expressed as (6+1)*D1−6*D2−+tY, and the second estimated time difference is the time difference between the time points t3 and t2.

Figure 7:
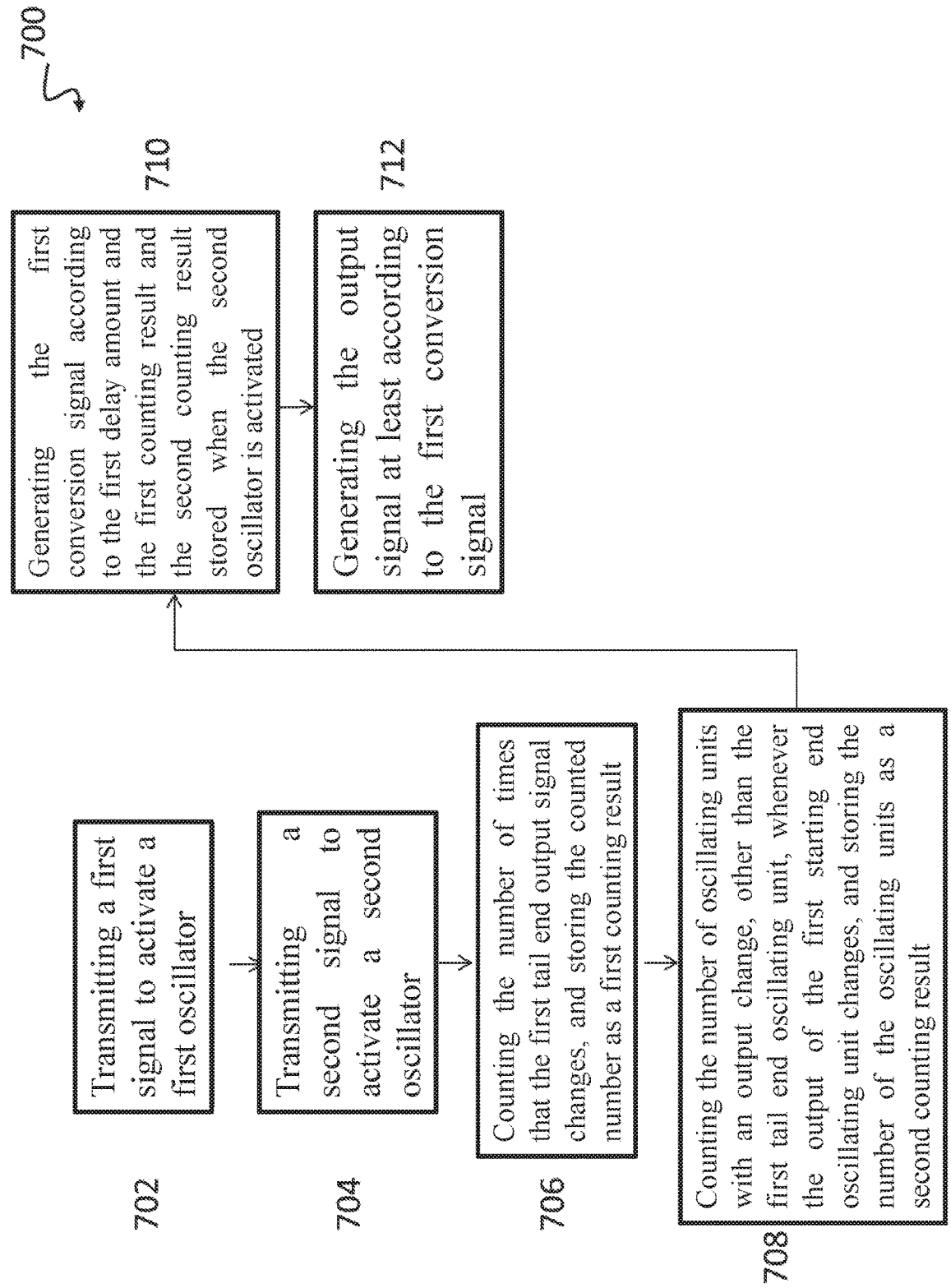
FIG. 7 is a flowchart illustrating a time-to-digital conversion method according to one embodiment of the present application.

FIG. 7 is a flowchart illustrating a time-to-digital conversion method 700 according to one embodiment of the present application. When performing the time-to-digital conversion method 700, the present application is not limited to the process steps shown in FIG. 7, so long as a substantially same result can be obtained. The time-to-digital conversion method 700 is summarized as follows:

Step 702: transmitting a first signal to activate a first oscillator.

Step 704: transmitting a second signal to activate a second oscillator.

Step 706: counting the number of times that the first tail end output signal changes, and storing the counted number as a first counting result.

Step 708: counting the number of oscillating units with an output change, other than the first tail end oscillating unit, whenever the output of the first starting end oscillating unit changes, and storing the number of the oscillating units as a second counting result.

Step 710: generating the first conversion signal according to the first delay amount and the first counting result and the second counting result stored when the second oscillator is activated.

Step 712: generating the output signal at least according to the first conversion signal.

Persons having ordinary skill in the art can readily understand the details of the time-to-digital conversion method 700, upon reading embodiments of FIG. 1 to FIG. 6, and hence a detailed description thereof is omitted herein for the sake of brevity.

What is claimed is:

1. A time-to-digital conversion circuit, characterized by comprising:
   a first oscillator, activated by a first signal, wherein the first oscillator comprises a plurality of oscillating units having a first delay amount, wherein a first starting end oscillating unit of the plurality of oscillating units in the first oscillator receives the first signal and a first tail end output signal, and a first tail end oscillating unit of the plurality of oscillating units in the first oscillator is configured to generate the first tail end output signal;
   a first counting circuit, coupled to the first oscillator and configured to count a number of times that the first tail end output signal changes, and store the counted number as a first counting result;
   a second counting circuit, coupled to the first oscillator, and configured to count a number of oscillating units with an output change, other than the first tail end oscillating unit, whenever an output of the first starting end oscillating unit changes, and store the number of the oscillating units as a second counting result;
   a second oscillator, coupled to the first oscillator through the first counting circuit and the second counting circuit, wherein the second oscillator is activated by a second signal;
   a first conversion circuit, coupled to the first counting circuit and the second counting circuit and configured to generate a first conversion signal according to the first delay amount and the first counting result and the second counting result stored when the second oscillator is activated, wherein the first conversion signal indicates a first estimated time difference; and
   a processing circuit, coupled to the first conversion circuit and configured to generate an output signal at least according to the first conversion signal, wherein the output signal represents a measured time difference between an activation time of the first signal and an activation time of the second signal.

2. The time-to-digital conversion circuit of claim 1, characterized in that the second oscillator comprises a plurality of oscillating units having a second delay amount, wherein a second starting end oscillating unit of the plurality of oscillating units in the second oscillator receives the second signal and a second tail end output signal, and a second tail end oscillating unit of the plurality of oscillating units generates the second tail end output signal.

3. The time-to-digital conversion circuit of claim 2, characterized by further comprising:
   a third counting circuit, coupled to the second oscillator, and configured to count a number of times that the second tail end output signal changes, and store the counted number as a third counting result; and
   a fourth counting circuit, coupled to the second oscillator, and configured to count a number of oscillating units with an output change in the second oscillator, other than the second tail end oscillating unit, and store the number of the oscillating units with the output change other than the second tail end oscillating unit in the second oscillator as a fourth counting result.

4. The time-to-digital conversion circuit of claim 2, characterized in that the first counting circuit is further configured to count a number of times that the second tail end output signal changes after the second oscillator is activated, and store the counted number as a third counting result; and the second counting circuit is further configured to count a number of oscillating units with an output change, other than the second tail end oscillating unit, after the second oscillator is activated, and store the number of the oscillating units as a fourth counting result.

5. The time-to-digital conversion circuit of claim 4, characterized by further comprising:
   a second conversion circuit, configured to generate a second conversion signal according to the first delay amount, the second delay amount, the third counting result and the fourth counting result, after the second oscillator is activated, wherein the second conversion signal indicates a second estimated time difference, and the second estimated time difference is smaller than the first delay amount.

6. The time-to-digital conversion circuit of claim 5, characterized in that the processing circuit generates the output signal according to the first conversion signal and the second conversion signal.

7. The time-to-digital conversion circuit of claim 5, characterized in that the second conversion circuit comprises:
   a logic circuit, configured to receive outputs of the plurality of oscillating units in the first oscillator after the second oscillator is activated and when the output of any oscillating unit in the second oscillator changes, and perform a logic operation to generate a logic result at least according to the output of the plurality of oscillating units in the first oscillator and the output of the oscillating unit with the output change in the second oscillator.

8. The time-to-digital conversion circuit of claim 7, characterized in that the second conversion circuit generates the second conversion signal according to the first delay amount, the second delay amount, and the third counting result and the fourth counting result obtained when the logic result changes.

9. The time-to-digital conversion circuit of claim 7, characterized by further comprising:
   a detection circuit, configured to selectively adjust oscillation frequency of the second oscillator according to the logic result.

10. The time-to-digital conversion circuit of claim 9, characterized in that the second conversion circuit generates the second conversion signal according to the first delay amount, the second delay amount, and the third counting result and the fourth counting result obtained after the oscillation frequency of the second oscillator changes and when the logic result changes.

11. A time-to-digital conversion method, characterized by comprising:
- transmitting a first signal to activate a first oscillator, wherein the first oscillator comprises a plurality of oscillating units having a first delay amount, and a first starting end oscillating unit of the plurality of oscillating units in the first oscillator receives the first signal and a first tail end output signal, wherein a first tail end oscillating unit of the plurality of oscillating units is configured to generate the first tail end output signal;
- transmitting a second signal to activate a second oscillator;
- counting a number of times that the first tail end output signal changes, and storing the counted number as a first counting result;
- counting a number of oscillating units with an output change, other than the first tail end oscillating unit, whenever an output of the first starting end oscillating unit changes, and storing the number of the oscillating units as a second counting result;
- generating a first conversion signal according to the first delay amount and the first counting result and the second counting result stored when the second oscillator is activated, wherein the first conversion signal indicates a first estimated time difference; and
- generating an output signal at least according to the first conversion signal, wherein the output signal represents a measured time difference between an activation time of the first signal and an activation time of the second signal.

12. The time-to-digital conversion method of claim 11, characterized in that the second oscillator comprises a plurality of oscillating units having a second delay amount, and a second starting end oscillating unit of the plurality of oscillating units in the second oscillator receives the second signal and a second tail end output signal, and a second tail end oscillating unit of the plurality of oscillating units generate the second tail end output signal.

13. The time-to-digital conversion method of claim 12, characterized by further comprising:
- counting a number of times that the second tail end output signal changes, and store the counted number as a third counting result; and
- counting a number of oscillating units with an output change in the second oscillator, other than the second tail end oscillating unit, and store the number of the oscillating units with the output change other than the second tail end oscillating unit in the second oscillator as a fourth counting result.

14. The time-to-digital conversion method of claim 12, characterized in further comprising:
- counting a number of times that the second tail end output signal changes after the second oscillator is activated, and storing the counted number as a third counting result; and
- counting a number of oscillating units with an output change, other than the second tail end oscillating unit, after the second oscillator is activated, and storing the number of the oscillating units as a fourth counting result.

15. The time-to-digital conversion method of claim 14, characterized by further comprising:
- generating a second conversion signal according to the first delay amount, the second delay amount, the third counting result and the fourth counting result, after the second oscillator is activated, wherein the second conversion signal indicates a second estimated time difference, and the second estimated time difference is smaller than the first delay amount.

16. The time-to-digital conversion method of claim 15, characterized in that, at least according to the first conversion signal to generate the output signal comprises:
- generating the output signal according to the first conversion signal and the second conversion signal.

17. The time-to-digital conversion method of claim 15, characterized in that generating the second conversion signal according to the first delay amount, the second delay amount, the third counting result and the fourth counting result comprises:
- receiving outputs of the plurality of oscillating units in the first oscillator after the second oscillator is activated and when the output of any oscillating unit in the second oscillator changes; and
- performing a logic operation to generate a logic result at least according to the output of the plurality of oscillating units in the first oscillator and the output of the oscillating unit with the output change in the second oscillator.

18. The time-to-digital conversion method of claim 17, characterized in that generating the second conversion signal according to the first delay amount, the second delay amount, the third counting result and the fourth counting result comprises:
- generating the second conversion signal according to the first delay amount, the second delay amount and the third counting result and the fourth counting result obtained when the logic result changes.

19. The time-to-digital conversion method of claim 17, characterized by further comprising:
- selectively adjusting oscillation frequency of the second oscillator according to the logic result.

20. The time-to-digital conversion method of claim 19, characterized in that generating the second conversion signal according to the first delay amount, the second delay amount, the third counting result and the fourth counting result comprises:
- generating the second conversion signal according to the first delay amount, the second delay amount, and the third counting result and the fourth counting result obtained after the oscillation frequency of the second oscillator changes and when the logic result changes.

* * * * *